United States Patent
Ma et al.

(10) Patent No.: US 11,102,438 B2
(45) Date of Patent: Aug. 24, 2021

(54) 2×2 ARRAY ARRANGEMENT BASED ON COMPOSITE DIELECTRIC GATE PHOTOSENSITIVE DETECTOR AND OPERATING METHOD THEREOF

(71) Applicant: NANJING UNIVERSITY, Jiangsu (CN)

(72) Inventors: Haowen Ma, Jiangsu (CN); Zhijian Huang, Jiangsu (CN); Yi Shi, Jiangsu (CN); Feng Yan, Jiangsu (CN); Limin Zhang, Jiangsu (CN); Xiaofeng Bu, Jiangsu (CN); Yuqian Li, Jiangsu (CN); Zhangnan Li, Jiangsu (CN); Xiangshun Kong, Jiangsu (CN); Cheng Mao, Jiangsu (CN); Cheng Yang, Jiangsu (CN); Xu Cao, Jiangsu (CN)

(73) Assignee: NANJING UNIVERSITY, Jiangsu (CN)

( * ) Notice: Subject to any disclaimer, the term of this patent is extended or adjusted under 35 U.S.C. 154(b) by 30 days.

(21) Appl. No.: 16/753,242

(22) PCT Filed: Mar. 23, 2018

(86) PCT No.: PCT/CN2018/080131
§ 371 (c)(1),
(2) Date: Apr. 2, 2020

(87) PCT Pub. No.: WO2019/127942
PCT Pub. Date: Jul. 4, 2019

(65) Prior Publication Data
US 2020/0336685 A1    Oct. 22, 2020

(30) Foreign Application Priority Data
Dec. 28, 2017  (CN) .......................... 201711458300.4

(51) Int. Cl.
*H04N 5/378* (2011.01)
*H04N 5/374* (2011.01)
(Continued)

(52) U.S. Cl.
CPC ............. *H04N 5/378* (2013.01); *H04N 5/374* (2013.01); *H01L 27/14603* (2013.01); *H01L 27/14643* (2013.01)

(58) Field of Classification Search
CPC ........ H04N 5/378; H04N 5/374; H04N 5/369; H04N 5/3696; H04N 5/372;
(Continued)

(56) References Cited

U.S. PATENT DOCUMENTS

| 5,751,631 A | 5/1998 | Liu et al. | |
|---|---|---|---|
| 8,604,409 B2 * | 12/2013 | Yan | H01L 31/1136 250/214.1 |

(Continued)

FOREIGN PATENT DOCUMENTS

| CN | 101038927 A | 9/2007 |
|---|---|---|
| CN | 101383371 A | 3/2009 |

(Continued)

*Primary Examiner* — Albert H Cutler
(74) *Attorney, Agent, or Firm* — Novick, Kim & Lee, PLLC; Allen Xue

(57) ABSTRACT

A two-by-two array consists of four pixels. Each pixel comprises one light-sensing transistor and one reading transistor. Both the light sensing transistor and the reading transistor are formed above a same P-type semiconductor substrate, and have a composite dielectric gate structure. The substrates of the four reading transistors are connected to form a regular octagonal ring structure located in the center of the array. On four sides of the regular octagonal ring structure, four heavily-doped N+ regions are formed on the substrates not covered with the composite dielectric gate, of which every two regions are opposite to each other and form right angles, wherein two opposite heavily-doped N+

(Continued)

regions are connected to form a shared N+ source, and the other two are connected to form a shared N+ drain.

6 Claims, 5 Drawing Sheets

(51) Int. Cl.
*H01L 27/146* (2006.01)
*H01L 27/02* (2006.01)

(58) Field of Classification Search
CPC ......... H01L 27/14603; H01L 27/14643; H01L 27/14612; H01L 27/1463; H01L 27/1461; H01L 27/02; H01L 27/0207
See application file for complete search history.

(56) References Cited

U.S. PATENT DOCUMENTS

| | | | | |
|---|---|---|---|---|
| 2005/0087780 | A1* | 4/2005 | Rhodes | ............. H01L 27/14689 |
| | | | | 257/291 |
| 2011/0025892 | A1* | 2/2011 | Hibbeler | ........... H01L 27/14609 |
| | | | | 348/294 |
| 2016/0372504 | A1* | 12/2016 | Kato | ................. H01L 27/14609 |
| 2018/0114806 | A1* | 4/2018 | Kim | ................. H01L 27/14603 |

FOREIGN PATENT DOCUMENTS

| | | | |
|---|---|---|---|
| CN | 102629614 | A | 8/2012 |
| CN | 102938409 | * | 2/2013 |
| CN | 104900667 | A | 9/2015 |

* cited by examiner

2×2 ARRAY ARRANGEMENT BASED ON COMPOSITE DIELECTRIC GATE PHOTOSENSITIVE DETECTOR AND OPERATING METHOD THEREOF

TECHNICAL FIELD OF THE INVENTION

The present invention relates to an imaging device array arrangement, and in particular to a detector array arrangement applicable to variable light and infrared light and an operating method of this array.

BACKGROUND OF THE INVENTION

CCDs and CMOS-APSs are two kinds of most common imaging devices at present.

Early CCDs are each formed of groups of MOS capacitors connected in series. The generation and change of a potential well on the surface of a semiconductor are controlled by a pulse sequence on the MOS capacitors, so that the storage, transfer and readout of photogenerated charges are realized. In this way, the imaging speed of CCDs is relatively slow. Moreover, since CCDs have high requirements on process, the yield is low and the cost is high. Generally, CMOS-APSs are each formed of one light-sensing diode and three to six transistors. The use of more transistors means more complex functions. CMOS-APSs read signals by X-Y addressing, so the imaging speed is faster than that of CCDs. Meanwhile, CMOS-APSs are compatible with the CMOS process and thus easily integrated with peripheral circuits. However, since multiple transistors are contained in pixels and the pixels have a low filling coefficient, CMOS-APSs are low in full-well charge capacity. To ensure high imaging quality, it is inappropriate to further reduce the pixel size.

It can be found from the above comparison that the imaging quality of the detector can be improved and the pixel size can be reduced if the CMOS-APS imaging device is high in filling coefficient. Accordingly, a dual-transistor photosensitive detector based on a composite dielectric gate MOSFET was proposed in Patent CN201210442007. This detector has separate functions of collecting and reading detector signals by using two transistors. Therefore, it is unnecessary to form a source and a drain in the light-sensing portion of the detector, and the interference between light-sensing transistors can be effectively prevented.

SUMMARY OF THE INVENTION

In view of the technical problems in the prior art, the present invention provides a 2×2 source/drain-shared array arrangement based on a composite dielectric gate MOSFET photosensitive detector by optimizing the arrangement of the photosensitive detector array, in order to increase the filling coefficient of a photosensitive detector, particularly for small-size pixels. Another objective of the present invention is to provide an operating method of the 2×2 source/drain-shared array.

For this purpose, the present invention employs the following technical solutions.

A 2×2 array arrangement based on a composite dielectric gate photosensitive detector is provided, wherein the array consists of four pixels, each of which includes a light-sensing transistor and a reading transistor; both the light sensing transistor and the reading transistor are formed above a same P-type semiconductor substrate, and are of a composite dielectric gate structure; and the composite dielectric gate has a bottom insulating dielectric layer, a charge coupled layer, a top insulating dielectric layer and a control gate stacked successively from the bottom up, wherein the charge coupled layers of the four light-sensing transistors are not in connection to each other, and the control gates of the four light-sensing transistors are not in connection to each other; the substrates of the four reading transistors are connected to form a regular octagonal ring structure and located in the center of the 2×2 array; on four sides of the regular octagonal ring structure, four heavily-doped N+ regions are formed on the substrates not covered with the composite dielectric gate by N+ ion implantation, of which every two regions are opposite to each other and form right angles, wherein two opposite heavily-doped N+ regions are connected to form a shared N+ source, and the other two are connected to form a shared N+ drain; and, the four light-sensing transistors are located on outer sides of the regular octagonal ring structure and on sides of four regions that are not heavily doped with N+.

Further, in each pixel, the light-sensing transistor and the reading transistor are isolated by a shallow trench isolation region in the substrate; and, the charge coupled layer of the light-sensing transistor is in connection to the charge coupled layer of the reading transistor, and the control gate of the light-sensing transistor is in connection to the control gate of the reading transistor.

Further, the four light-sensing transistors are isolated by shallow trench isolation regions in the P-type semiconductor substrate.

Further, at least one of the control gate surface and the substrate of the light-sensing transistor is a transparent or semitransparent window for a wavelength to be detected by the detector.

Further, the control gates of the four light-sensing transistors form a word line WL0, a word line WL1, a word line WL2 and a word line WL3, respectively; the drains of the four reading transistors form a drain line DL; and the sources of the four reading transistors form a source line SL.

The present invention provides an operating method of a 2×2 array arrangement based on a composite dielectric gate photosensitive detector, comprising following steps:

(1) Photoelectron Collection:

applying a negative bias onto a substrate of a photosensitive detector, applying a same zero bias or positive bias onto a word line WL0, a word line WL1, a word line WL2 and a word line WL3, and connecting a drain line DL and a source line SL of a reading transistor to the ground;

(2) Photoelectron Reading:

maintaining the negative bias applied onto the substrate, maintaining the bias applied onto the word line WL0, the word line WL1, the word line WL2 and the word line WL3, applying a positive bias onto the drain line DL of the reading transistor, connecting the source line SL of the reading transistor to the ground, applying a ramp voltage onto a word line of a light-sensing transistor to be read, and calculating a photoelectronic signal by using the value of the ramp voltage when the reading transistor is turned on; and, at the end of reading, connecting the drain line DL and the source line SL of the reading transistor to the ground, maintaining the bias applied onto the control gate of the read light-sensing transistor during shutter, and successively reading photoelectronic signals in four light-sensing transistors in the above way; and (3) Photoelectron Resetting:

applying, onto the word line WL0, the word line WL1, the word line WL2 and the word line WL3, a negative bias that is the same as that applied onto the substrate, and connecting the drain line DL and the source line SL of the reading transistor to the ground so that photoelectrons disappear by recombination.

The present invention has the advantages of both CCD and CMOS-APS detectors, and reduces the number of transistors in a single detector. Compared with the discrete drawing method in the prior art, the array arrangement designed in the present invention can effectively increase the filling coefficient of pixels of the detector, increase the full-well charge capacity and greatly improve the signal-to-noise ratio and imaging quality of the detector. Moreover, the array structure provided by the present invention can reduce the size of the photosensitive detector and realize an imaging array with a high pixel density, and is compatible with the floating gate CMOS process and easy to implement.

DETAILED DESCRIPTION OF THE INVENTION

Figure 1:
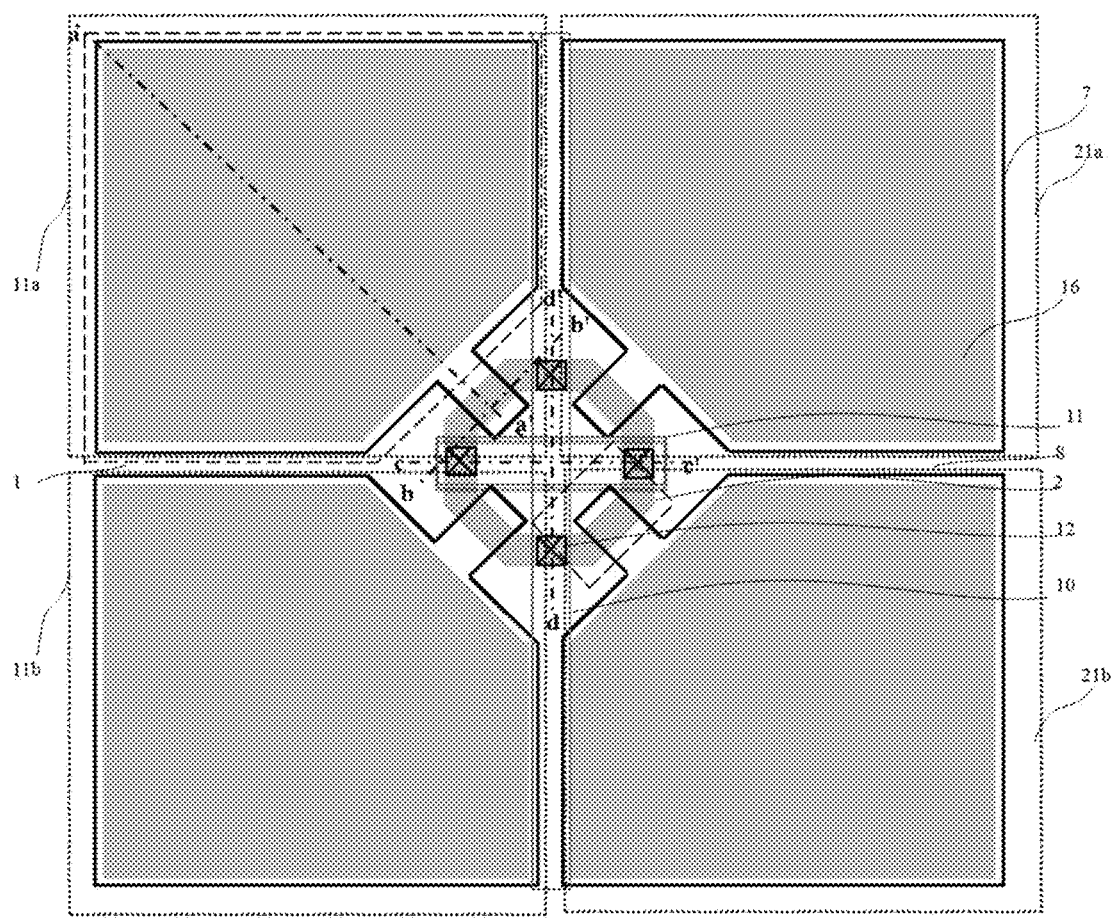
FIG. 1 is a structure diagram of a 2×2 source/drain-shared array arrangement based on a composite dielectric gate MOSFET photosensitive detector.
Figure 2:
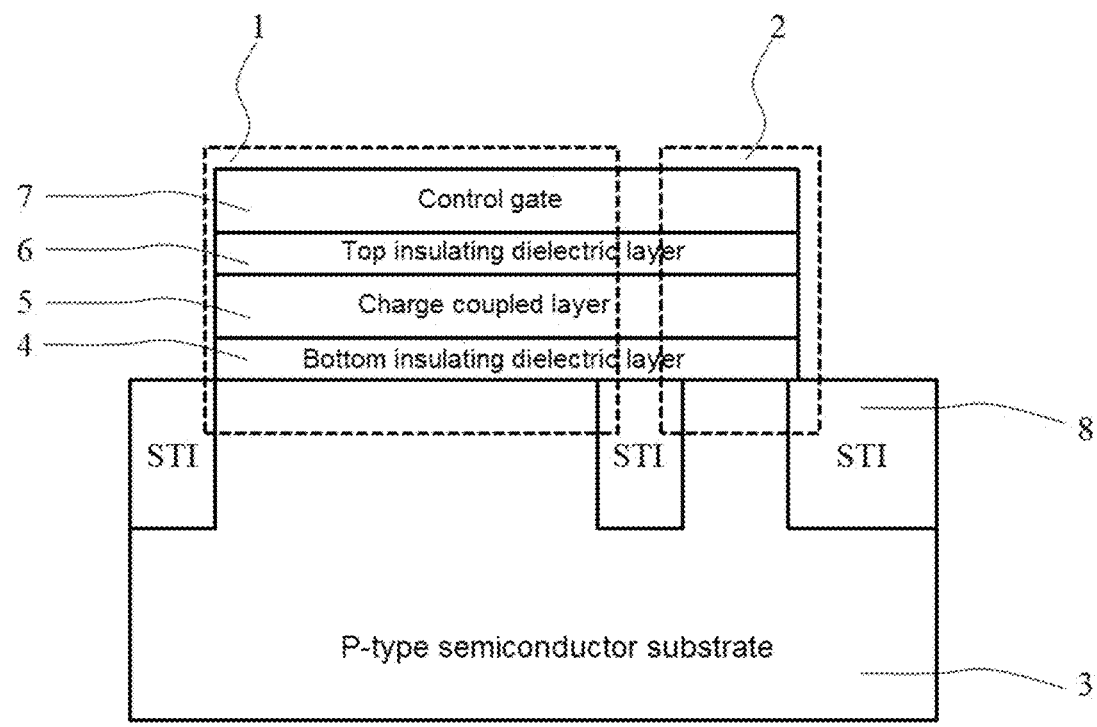
FIG. 2 is a sectional view of FIG. 1 along aa'.
Figure 3:
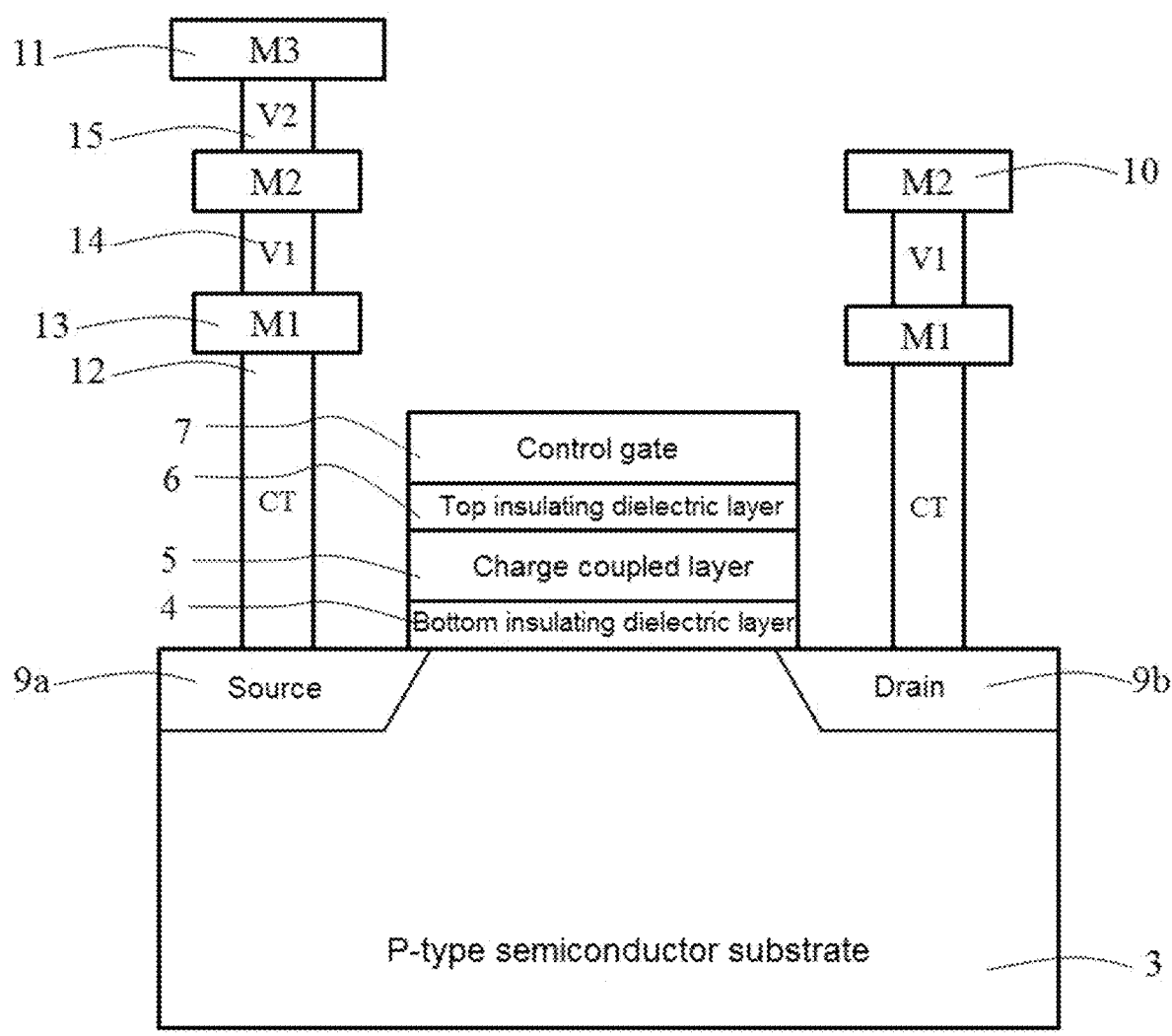
FIG. 3 is a sectional view of FIG. 1 along bb'.

This embodiment provides a 2×2 source/drain-shared array arrangement based on a composite dielectric gate MOSFET photosensitive detector. The layout diagram is shown in FIG. 1. The 2×2 array includes four detection units, each of which includes one light-sensing transistor 1 and one reading transistor 2. Both the light-sensing transistor 1 and the reading transistor 2 are stacked above a same P-type semiconductor substrate 3, and are of a composite dielectric gate structure. Specifically, a bottom insulating dielectric layer 4, a charge coupled layer 5, a top insulating dielectric layer 6 and a control gate 7 are stacked above the substrate 3 successively from the bottom up. The P-type semiconductor substrate 3 below the light-sensing transistor 1 and the reading transistor 2 is isolated by a shallow trench isolation (STI) region 8. In each detection unit, the charge coupled layer of the light-sensing transistor 1 is in connection to the charge coupled layer of the reading transistor 2, the control gate of the light-sensing transistor 1 is in connection to the control gate of the reading transistor 2, and a photoelectronic signal is read by charge coupling. For the reading transistor 2, an N-type source 9a is formed on a side of the P-type semiconductor substrate 3 close to the bottom insulating dielectric layer 4 by ion implantation, and an N-type drain 9b is formed on the other side of the P-type semiconductor substrate 3 by ion implantation. The structure of the detector can refer to the contents disclosed in Patent No. CN102938409A.

The four detection units 11a, 11b, 21a and 21b form a square 2×2 array. Active regions 16 of the four reading transistors 2 are connected to form a regular octagonal ring structure located in the center of the whole 2×2 array. In the regular octagonal ring formed of the reading transistors 2 and on the P-type semiconductor substrates on four isolation sides, four heavily-doped N+ regions are formed in regions not covered with the composite dielectric gate by N+ ion implantation, and every two of the four heavily-doped N+ regions are opposite to each other and form a right angle (90°). Two opposite heavily-doped N+ regions are connected to form a shared N+ source, and the other two opposite heavily-doped N+ regions are connected to form a shared N+ drain. The light-sensing transistors 1 are located on outer sides along four bevel edges of the regular octagonal ring structure, i.e., being located outside four regions that are not heavily doped with N+. The four light-sensing transistors 1 are isolated by shallow trench isolation regions 8 on the P-type semiconductor substrate, the charge coupled layers 5 of the four light-sensing transistors 1 are not in connection to each other, and the control gates 7 of the four light-sensing transistors 1 are not in connection to each other. At least one of the control gate surface and the substrate of the light-sensing transistor 1 is a transparent or semitransparent window for a wavelength to be detected by the detector.

Figure 4:
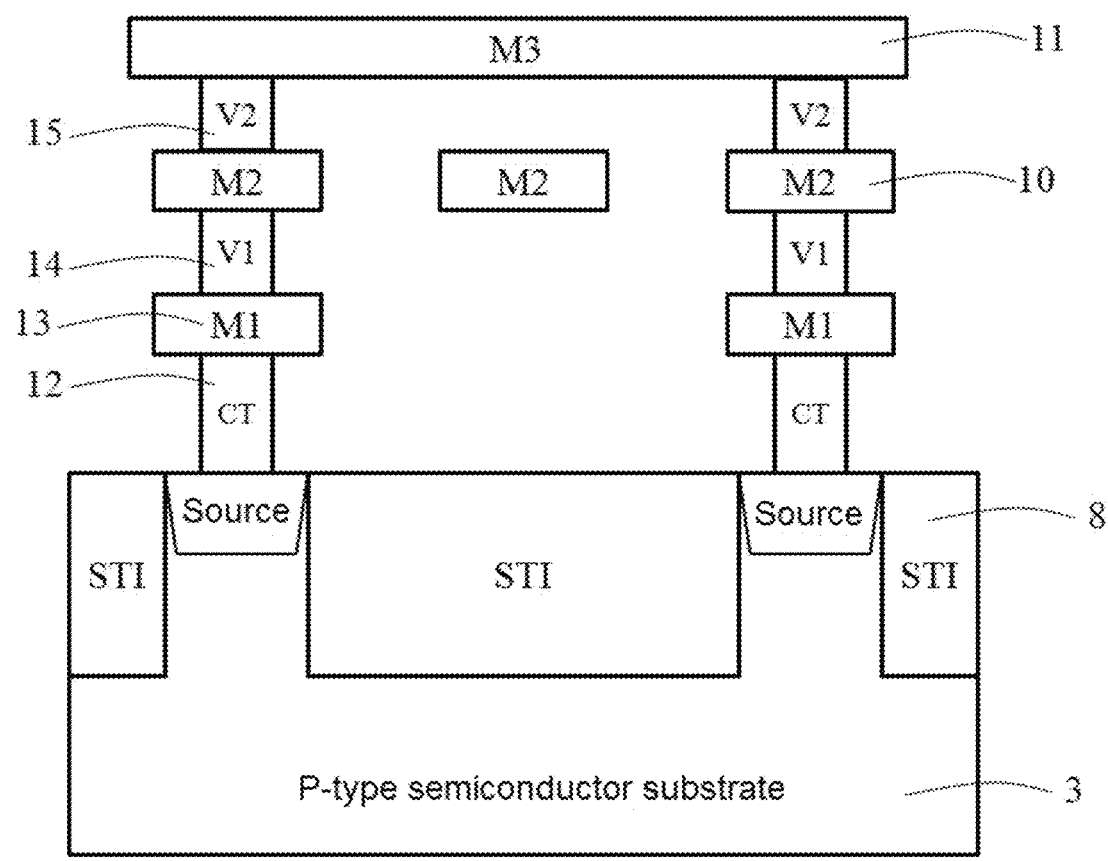
FIG. 4 is a sectional view of FIG. 1 along cc'.
Figure 5:
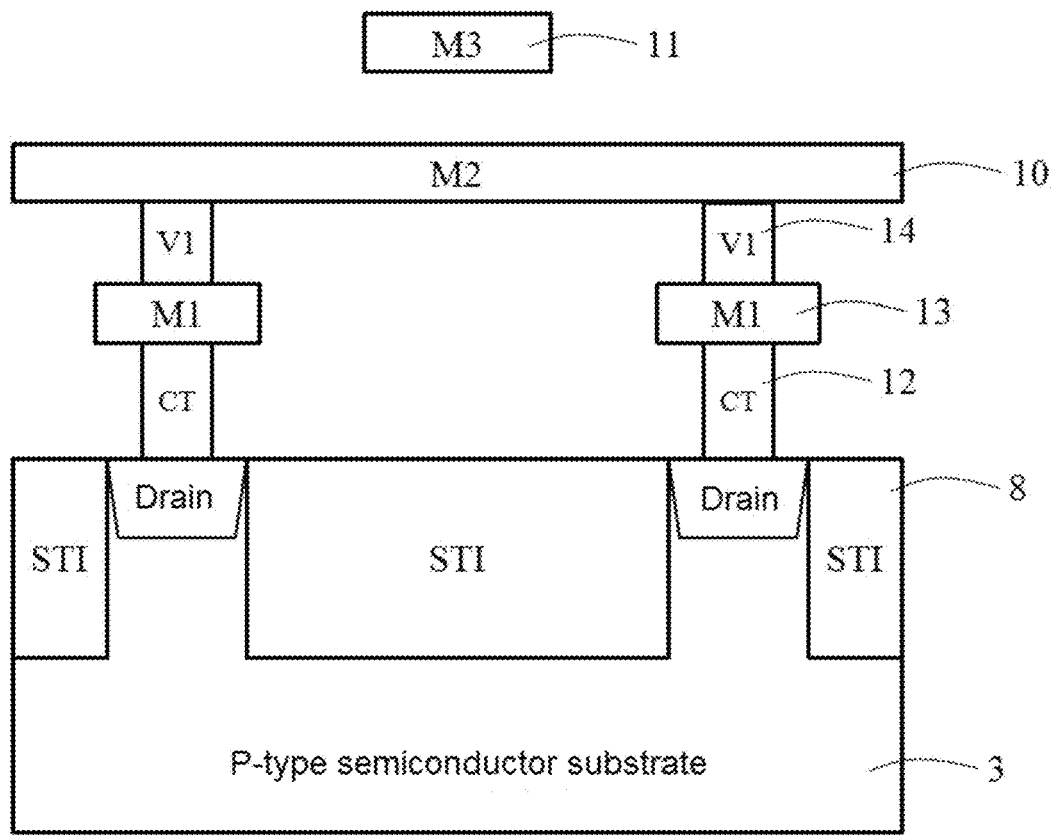
FIG. 5 is a sectional view of FIG. 1 along dd'.

As shown in FIG. 4, the charge coupled layers 5 of the light-sensing transistors 1 in the four detection units 11a, 11b, 21a and 21b are not in connection to each other, and the control gates 7 of the light-sensing transistors 1 in the four detection units 11a, 11b, 21a and 21b are also not in connection to each other. The reading transistor 2 in the detection unit 11a and the reading transistor 2 in the detection unit 11b share a same source 9a, the reading transistor 2 in the detection unit 21a and the reading transistor 2 in the detection unit 21b share a same source 9a, and the two sources are connected through a contact hole (CT) 12, a metal 1 (M1) 13, a via 1 (V1) 14, a metal 2 (M2) 10, a via 2 (V2) 15 and a metal 3 (M3) 11. The reading transistor 2 in the detection unit 11a and the reading transistor 2 in the detection unit 21a share a same drain 9b, the reading transistor 2 in the detection unit 11b and the reading transistor 2 in the detection unit 21b share a same drain 9b, and the two drains are connected through a contact hole (CT) 12, a metal 1 (M1) 13, a via 1 (V1) 14 and a metal 2 (M2) 10, as shown in FIG. 5.

Figure 6:
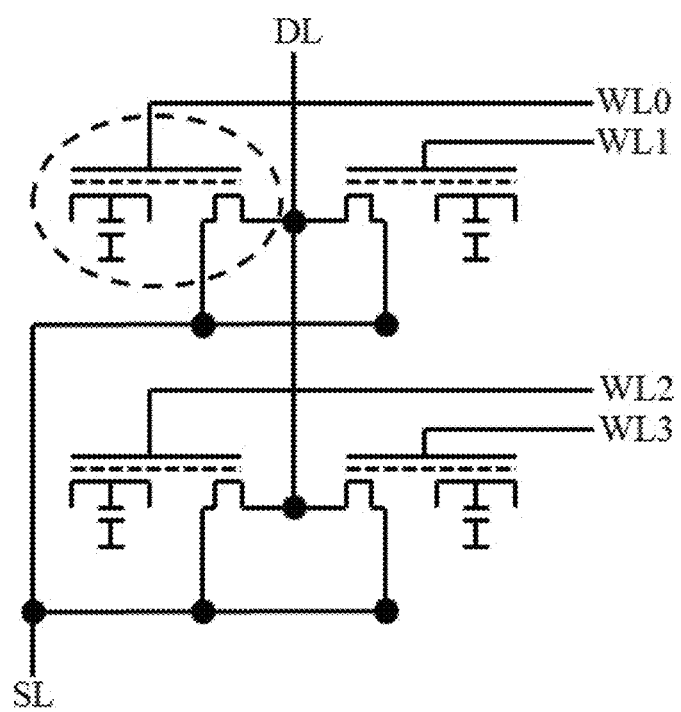
FIG. 6 is an equivalent circuit diagram of the 2×2 source/drain-shared array arrangement based on a composite dielectric gate MOSFET photosensitive detector.

FIG. 6 shows an equivalent circuit diagram of the 2×2 source/drain-shared array, where the dashed box represents a detection unit. The control gates 7 of the light-sensing transistors 1 in the four detection units form a word line WL0, a word line WL1, a word line WL2 and a word line WL3, respectively; the sources 9a shared by the reading transistors 2 form a source line SL; and the drains 9b shared by the reading transistors 2 form a drain line DL.

The operating method of the 2×2 source/drain-shared array will be described below.

(1) Photoelectron Collection: A negative bias is applied onto the substrate of the detector array, a same positive bias or zero bias is applied onto the word lines WL0, WL1, WL2 and WL3, and the source line SL and the drain line DL are connected to the ground.

(2) Photoelectron Reading:

The bias applied onto the substrate and the bias applied onto the word lines WL0, WL1, WL2 and WL3 are maintained, a positive bias is applied onto the drain line DL, and the source line SL is connected to the ground. A ramp voltage is applied onto the word line of the light-sensing transistor 1 in the detection unit to be read, and a photoelectronic signal is calculated by using the value of the ramp voltage when the reading transistor 2 is turned on. When the reading of one detection unit is completed, the drain line DL and the source line SL are connected to the ground, and the bias applied onto the control gate 7 of the read light-sensing transistor 1 during shutter is maintained. The photoelectronic signals in the remaining detection units are read successively in the above way.

(3) Photoelectron Resetting:

A negative bias, which is the same as that applied onto the substrate, is applied onto the word line WL0, the word line WL1, the word line WL2 and the word line WL3, and the drain line DL and the source line SL of the reading transistor are connected to the ground so that photoelectrons disappear by recombination.

The pixel filling coefficient is defined as the ratio of the effective area of the light-sensing transistor in a pixel to the area of the pixel. In accordance with the same design rule, if the area of a single pixel is 2 um×2 um, the filling coefficient can up to 70% according to the pixels in the source/drain-shared array arrangement design provided by the present invention. The filling coefficient in the existing discrete drawing method is less than 60%. Moreover, as the pixel size is further reduced, the high filling coefficient in the present invention will be increased in comparison to the discrete drawing method.

Figure 7:
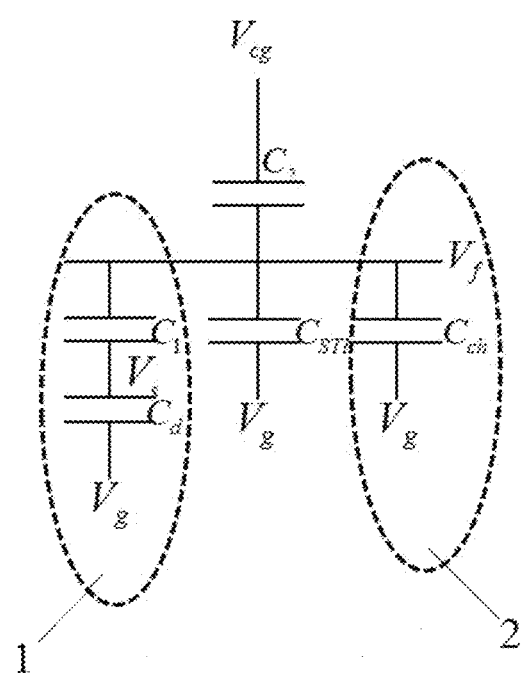
FIG. 7 is a capacitance model diagram of a single detection unit.

The 2×2 detector array provided by the present invention can increase the filling coefficient of pixels and improve the sensitivity of the detection units, because the change in the threshold voltage of the reading transistor 2 and the number of photoelectrons collected by the light-sensing transistor 1 satisfies the following relationship:

$$\Delta V_{cg} = \frac{C_1 + C_2}{C_2^2} \times \Delta Q$$

where $C_1$ represents the capacitance of the bottom insulating dielectric layer 4 of the light-sensing transistor 1, $C_2$ represents the capacitance between the charge coupled layer 5 and the control gate 7 of the light-sensing transistor 1, $\Delta Q$ represents the number of photoelectrons collected by the light-sensing transistor 1, and $\Delta V_{cg}$ represents the change in the potential of the charge coupled layer 5. The equivalent capacitance of the detection unit is shown in FIG. 7. To simplify calculation, the remaining capacitances are not considered since they are negligible relative to $C_1$ and $C_2$. When the area of a single detection unit remains unchanged, the magnitude of the capacitance $C_2$ remains unchanged, and the capacitance $C_1$ increases with the increase of the pixel filling coefficient. Therefore, the coefficient $$\frac{C_1 + C_2}{C_2^2}$$

on the right of the equation increases with the increase of the filling coefficient, that is, since the gain of converting the unit charge into the voltage increases, the sensitivity of the detection unit is improved.

The invention claimed is:

1. A 2×2 array arrangement based on a composite dielectric gate photosensitive detector, characterized in that the array consists of four pixels, each of which comprises one light-sensing transistor and one reading transistor; both the light sensing transistor and the reading transistor are formed above a same P-type semiconductor substrate, and are of a composite dielectric gate structure; and the composite dielectric gate has a bottom insulating dielectric layer, a charge coupled layer, a top insulating dielectric layer and a control gate stacked successively from the bottom up, wherein the charge coupled layers of the four light-sensing transistors are not in connection to each other, and the control gates of the four light-sensing transistors are not in connection to each other;

the substrates of the four reading transistors are connected to form a regular octagonal ring structure and located in the center of the 2×2 array; on four sides of the regular octagonal ring structure, four heavily-doped N+ regions are formed on the substrates not covered with the composite dielectric gate by N+ ion implantation, of which every two regions are opposite to each other and form right angles, wherein two opposite heavily-doped N+ regions are connected to form a shared N+ source, and the other two are connected to form a shared N+ drain; and the four light-sensing transistors are located on outer sides of the regular octagonal ring structure and on sides of four regions that are not heavily doped with N+.

2. The 2×2 array arrangement based on a composite dielectric gate photosensitive detector according to claim 1, characterized in that, in each pixel, the light-sensing transistor and the reading transistor are isolated by a shallow trench isolation region in the substrate; and, the charge coupled layer of the light-sensing transistor is in connection to the charge coupled layer of the reading transistor, and the control gate of the light-sensing transistor is in connection to the control gate of the reading transistor.

3. The 2×2 array arrangement based on a composite dielectric gate photosensitive detector according to claim 1, characterized in that the four light-sensing transistors are isolated by shallow trench isolation regions in the P-type semiconductor substrate.

4. The 2×2 array arrangement based on a composite dielectric gate photosensitive detector according to claim 1, characterized in that at least one of the control gate surface and the substrate of the light-sensing transistor is a transparent or semitransparent window for a wavelength to be detected by the detector.

5. The 2×2 array arrangement based on a composite dielectric gate photosensitive detector according to claim 1, characterized in that the control gates of the four light-sensing transistors form a word line WL0, a word line WL1, a word line WL2 and a word line WL3, respectively; the drains of the four reading transistors form a drain line DL; and the sources of the four reading transistors form a source line SL.

6. An operating method of the 2×2 array arrangement based on a composite dielectric gate photosensitive detector according to claim 5, comprising following steps:

(1) photoelectron collection:

applying a negative bias onto a substrate of a photosensitive detector, applying a same zero bias or positive bias onto a word line WL0, a word line WL1, a word line WL2 and a word line WL3, and connecting a drain line DL and a source line SL of a reading transistor to the ground;

(2) photoelectron reading:

maintaining the negative bias applied onto the substrate, maintaining the bias applied onto the word line WL0, the word line WL1, the word line WL2 and the word line WL3, applying a positive bias onto the drain line DL of the reading transistor, connecting the source line SL of the reading transistor to the ground, applying a ramp voltage onto a word line of a light-sensing transistor to be read, and calculating a photoelectronic signal by using the value of the ramp voltage when the reading transistor is turned on; and, at the end of reading, connecting the drain line DL and the source line SL of the reading transistor to the ground, maintaining the bias applied onto the control gate of the read light-sensing transistor during shutter, and successively reading photoelectronic signals in four light-sensing transistors in the above way; and (3) photoelectron resetting:

applying, onto the word line WL0, the word line WL1, the word line WL2 and the word line WL3, a negative bias that is the same as that applied onto the substrate, and connecting the drain line DL and the source line SL of the reading transistor to the ground so that photoelectrons disappear by recombination.

\* \* \* \* \*